(12) United States Patent
Sinha et al.

(10) Patent No.: US 9,552,990 B2
(45) Date of Patent: Jan. 24, 2017

(54) STORAGE AND SUB-ATMOSPHERIC DELIVERY OF DOPANT COMPOSITIONS FOR CARBON ION IMPLANTATION

(71) Applicants: Ashwini K. Sinha, East Amherst, NY (US); Douglas C. Heiderman, Akron, NY (US); Lloyd A. Brown, East Amherst, NY (US); Serge M. Campeau, Lancaster, NY (US); Robert Shih, HsinChu (TW); Dragon Lu, Miaoli County (TW); Wen-Pin Chiu, Hsin-chu County (TW); Chien-Kang Kao, New Taipei (TW)

(72) Inventors: Ashwini K. Sinha, East Amherst, NY (US); Douglas C. Heiderman, Akron, NY (US); Lloyd A. Brown, East Amherst, NY (US); Serge M. Campeau, Lancaster, NY (US); Robert Shih, HsinChu (TW); Dragon Lu, Miaoli County (TW); Wen-Pin Chiu, Hsin-chu County (TW); Chien-Kang Kao, New Taipei (TW)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 306 days.

(21) Appl. No.: 14/136,452

(22) Filed: Dec. 20, 2013

(65) Prior Publication Data

US 2014/0179090 A1      Jun. 26, 2014

Related U.S. Application Data

(60) Provisional application No. 61/820,873, filed on May 8, 2013, provisional application No. 61/745,124, filed on Dec. 21, 2012.

(51) Int. Cl.
*H01L 21/425* (2006.01)
*H01L 21/265* (2006.01)
(Continued)

(52) U.S. Cl.
CPC ........... *H01L 21/265* (2013.01); *C01B 3/00* (2013.01); *C23C 14/34* (2013.01); *F17C 1/005* (2013.01);
(Continued)

(58) Field of Classification Search
CPC .......... H01L 21/265; C01B 3/00; C23C 14/32; C23C 14/34; C23C 14/48; H01J 37/3002; H01J 37/3171
(Continued)

(56) References Cited

U.S. PATENT DOCUMENTS 6,089,027 A   7/2000  Wang et al.
6,101,816 A   8/2000  Wang et al.
(Continued)

OTHER PUBLICATIONS

ATMI VAC™ Package. User Guide for Ion Implantation. Marketing Brochure, http://web.archive.org/web/20120203135839/http://www.mathesongas.com/pdfs/products/User-Guide-for-VAC-Package.pdf—Feb. 3, 2012 (Wayback Machine).

*Primary Examiner* — Kevin M Picardat
(74) *Attorney, Agent, or Firm* — Nilay S. Dalal

(57) ABSTRACT

A supply source for delivery of a CO-containing dopant gas composition is provided. The composition includes a controlled amount of a diluent gas mixture such as xenon and hydrogen, which are each provided at controlled volumetric ratios to ensure optimal carbon ion implantation performance. The composition can be packaged as a dopant gas kit consisting of a CO-containing supply source and a diluent mixture supply source. Alternatively, the composition can be pre-mixed and introduced from a single source that can be
(Continued)

actuated in response to a sub-atmospheric condition achieved along the discharge flow path to allow a controlled flow of the dopant mixture from the interior volume of the device into an ion source apparatus.

21 Claims, 7 Drawing Sheets

(51) Int. Cl.
*C01B 3/00* (2006.01)
*C23C 14/34* (2006.01)
*H01J 37/317* (2006.01)
*H01J 37/30* (2006.01)
*F17C 1/00* (2006.01)

(52) U.S. Cl.
CPC ........ *H01J 37/3002* (2013.01); *H01J 37/3171* (2013.01); *F17C 2201/0109* (2013.01); *F17C 2201/0114* (2013.01); *F17C 2201/035* (2013.01); *F17C 2201/058* (2013.01); *F17C 2203/0617* (2013.01); *F17C 2205/035* (2013.01); *F17C 2205/0329* (2013.01); *F17C 2205/0332* (2013.01); *F17C 2205/0335* (2013.01); *F17C 2205/0338* (2013.01); *F17C 2205/0385* (2013.01); *F17C 2205/0391* (2013.01); *F17C 2225/038* (2013.01); *F17C 2260/044* (2013.01); *F17C 2270/0518* (2013.01); *F17C 2270/0745* (2013.01); *H01J 2237/006* (2013.01); *Y02E 60/321* (2013.01); *Y10T 137/2012* (2015.04)

(58) Field of Classification Search
USPC ................ 438/514, 503, 505–508; 252/373; 118/723 R, 723 VE
See application file for complete search history.

(56) References Cited

U.S. PATENT DOCUMENTS

| | | |
|---|---|---|
| 6,132,492 A | 10/2000 | Hultquist et al. |
| 6,511,760 B1 | 1/2003 | Barone et al. |
| 7,301,160 B2 | 11/2007 | Banks |
| 7,494,530 B2 | 2/2009 | Carruthers |
| 7,586,109 B2 | 9/2009 | Perel et al. |
| 7,655,931 B2 | 2/2010 | Gupta |
| 7,905,247 B2 | 3/2011 | Cameau |
| 7,973,293 B2 | 7/2011 | Lin et al. |
| 2002/0175144 A1* | 11/2002 | Hung ................ H01L 21/31116 216/67 |
| 2008/0237496 A1 | 10/2008 | Gupta |
| 2010/0032639 A1 | 2/2010 | Xu |
| 2011/0021011 A1 | 1/2011 | Sweeney et al. |
| 2011/0259366 A1 | 10/2011 | Sweeney et al. |
| 2012/0118232 A1 | 5/2012 | Colvin et al. |
| 2012/0119113 A1 | 5/2012 | Colvin et al. |
| 2013/0078790 A1 | 3/2013 | Sweeney et al. |
| 2013/0140473 A1 | 6/2013 | Colvin et al. |
| 2013/0264492 A1* | 10/2013 | Mayer ..................... C09K 3/00 250/428 |
| 2015/0357152 A1* | 12/2015 | Jones ..................... H01J 37/08 222/3 |

* cited by examiner

Deposit formation during extended operation using CO gas mixes 1 and 2

STORAGE AND SUB-ATMOSPHERIC DELIVERY OF DOPANT COMPOSITIONS FOR CARBON ION IMPLANTATION

CROSS REFERENCE TO RELATED APPLICATIONS

This application claims priority to U.S. provisional application Ser. No. 61/820,873 filed May 8, 2013 and 61/745,124 filed Dec. 21, 2012, the disclosures of which are incorporated by reference herein in their entirety.

FIELD OF THE INVENTION

The present invention relates to improved CO-based formulations and sub-atmospheric delivery and storage devices of such CO-based formulations, including dopant gas compositions utilized for carbon implantation.

BACKGROUND OF THE INVENTION

Ion implantation is an important process in semiconductor/microelectronic manufacturing. The ion implantation process is used in integrated circuit fabrication to introduce controlled amounts of dopant ions into semiconductor wafers. An ion-source is used to generate a well-defined ion beam for a variety of ion species from a dopant gas. Ionization of the dopant gas generates the ion species which can be subsequently implanted into a given workpiece.

Carbon has emerged as a widely used dopant in the semiconductor industry for a variety of material modification applications such as inhibiting diffusion of co-dopants or enhancing stability of the doped region. In this regard, carbon dioxide ($CO_2$) has emerged as a common dopant source for carbon ion implantation. However, it has been observed that CO2 behaves as an oxidizing gas which tends to oxidize tungsten ion chamber components to form various tungsten oxide (WOx) deposits along electrode surfaces and chamber components of the ion apparatus. The occurrences of such deposits are problematic, as they deteriorate the electrical properties, thereby requiring a higher voltage to sustain a stable plasma. However, higher voltages can result in voltage discharge, which causes electrical shorting and momentary drops in the beam current. The beam current drops are commonly referred to as "beam glitching". The beam glitching degrades the ion source performance to a degree where the process cannot operate with acceptable efficiency. In such cases, the user may be required to abort the implant operation and perform maintenance or replace the ion source. Such downtime results in productivity loss of the ion implantation system. Hence, it is necessary to maintain proper functioning of the ion source for extended periods of time in order to perform a high quality implant process.

In view of the undesirable deposits associated with CO2 as a dopant source for ion implantation, carbon monoxide (CO) has emerged as an alternative dopant gas source as a result of the lower oxygen content in CO. The lower oxygen content reduces the amount of WOx formation. However, CO has been observed to form heavy carbon (C) and tungsten carbide (WC) deposits during the operation of the ion source. C deposits are a result of plasma decomposition of CO, whereas WC deposits form as a result of the interaction of CO and its plasma fragmented products with tungsten-based chamber components. The C/WC deposits can create beam glitching, thereby creating concerns of short ion source life.

Furthermore, CO is a toxic gas which poses significant safety and environmental challenges. CO is typically stored in cylinders under high pressures. Storage of CO under high pressure is unacceptable because of the possibility of developing a leak or catastrophic rupture of the cylinder. Accordingly, standard high pressure cylinders for CO pose hazards of the unintended release of these fluids from high pressure cylinders.

There is an unmet need to reduce deposits in an ion chamber when utilizing a carbon-based dopant gas source for carbon implantation, along with a method and system for a safe storage and delivery device for carbon-based dopant gas sources. Other aspects of the present invention will become apparent to one of ordinary skill in the art upon review of the specification, drawings and claims appended hereto.

SUMMARY OF THE INVENTION

The present invention relates to carbon ion implantation systems and processes that are capable of achieving improved lifetime and performance of such ion sources.

The present invention relates, in part, to a single source supply for a CO-based dopant gas mixture delivered under sub-atmospheric conditions.

In a first aspect, a single source supply for a dopant gas mixture is provided, comprising: one or more carbon-containing dopant source gases pre-mixed at a predetermined concentration with a diluent gas mixture, said one or more carbon-containing sources comprising at least CO, and said diluent gas mixture comprising an inert gas and a hydrogen-containing gas; and a sub-atmospheric delivery and storage device for maintaining the dopant gas mixture in a pressurized state within an interior volume of the device, said delivery device in fluid communication with a discharge flow path, wherein said delivery device is actuated to allow a controlled flow of the dopant composition from the interior volume of the device in response to a sub-atmospheric condition achieved along the discharge flow path.

In a second aspect, a method for delivering a dopant gas composition for ion implantation is provided, comprising: providing one or more carbon-containing dopant gases; providing a diluent gas composition comprising an inert gas and a hydrogen-containing gas; actuating controlled flow of the one or more carbon-containing dopant gases in response to a predetermined vacuum condition; actuating controlled flow of the diluent gas composition in response to the predetermined vacuum condition; introducing the one or more carbon-containing dopant gases into an ion source chamber; introducing the diluent gas composition into the ion source chamber; ionizing the one or more carbon-containing dopant gas sources to produce carbon ions; and implanting the carbon ions into a substrate; wherein the one or more carbon-containing dopant gas sources interacts with the diluents gas composition to reduce deposits along the carbon ion source without producing a substantial reduction in carbon ion beam current in comparison to pure CO.

In a third aspect, a gas composition is provided, comprising: a carbon-based material comprising carbon monoxide; an inert diluent gas mixture comprising xenon (Xe) and hydrogen, wherein the Xe and the hydrogen are contained in an effective amount, said effective amount being in a volume ratio of $Xe:H2$ from about 0.02 to about 0.20; and wherein said $(Xe+H_2):CO$ is contained in a volume ratio ranging from about 0.10 to about 0.30.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein:

FIG. 1b shows a vacuum actuated check valve disposed entirely within the delivery and storage device of FIG. 1a;

DETAILED DESCRIPTION OF THE INVENTION

Figure 1A:
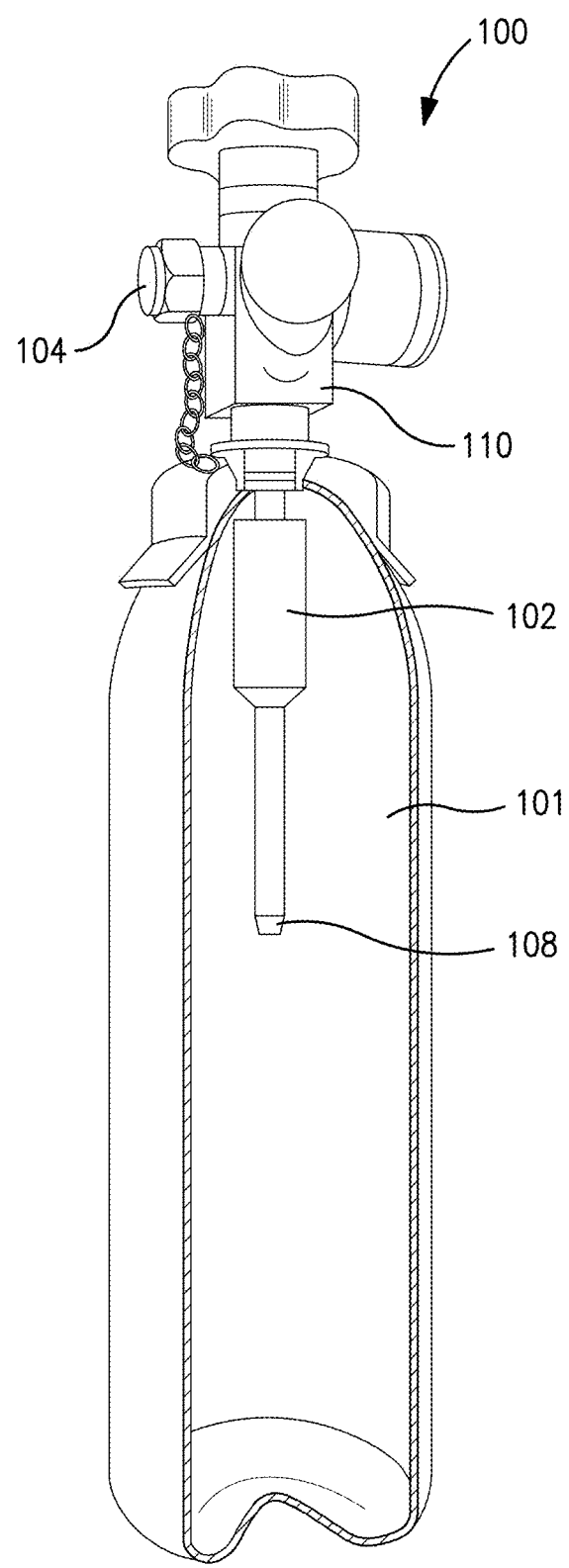
FIG. 1a shows a sub-atmospheric delivery and storage device for dispensing a CO-containing dopant composition in accordance with the principles of the present invention.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof As used herein, unless indicated otherwise, all concentrations are expressed as volumetric percentages ("vol %").

The invention may include any of the following embodiments in various combinations and may also include any other aspect described below in the written description or in the attached drawings.

As mentioned, although pure CO can generate a relatively high C+ beam current, significant heavy carbon (C) and tungsten carbide (WC) deposits can create beam glitching and shorten the ion source life. The addition of hydrogen (H2) to CO has been known to reduce deposit formation. The H2 and CO interact to reduce the overall deposit formation in the ion chamber when utilizing CO as the carbon-containing source material. However, the reduction in deposit formation occurs at the expense of lower C+ beam current.

The present invention improves upon the CO—H2 mixture by the addition of Xe in specific volume ratios, as will be describe, to improve the C+ beam current. In particular, and as will be shown in the Examples, the beam current of C+ ions can be increased by greater than 20% in comparison to the C+ beam current obtained by using a dopant gas mixture consisting of CO and H2. In this manner, unlike the prior art, the present invention allows the ability to achieve extended ion source life and increase C+ beam current in comparison to CO and H2.

One embodiment of the present invention is directed to a carbon-containing dopant gas composition that preferably contains CO and a diluent mixture. The CO may be pre-mixed with the diluent mixture, which includes an inert gas and a hydrogen-containing gas. The term "dopant gas composition" as used herein and throughout the specification is intended to refer to the resultant composition formed upstream or within the ion source chamber. The term "dopant gas composition" " as used herein and throughout the specification is also intended to refer the mixture contained with a single supply source, as will be explained in greater detail.

It has been found that introducing a dopant gas composition in an ion source chamber that comprises CO with a diluent gas mixture including an inert gas and a hydrogen-containing gas in a selected volume ratio allows the requisite balance of ion source life with ion source performance to be achieved. In a preferred embodiment, the dopant gas mixture includes CO in combination with an inert diluent gas mixture consisting essentially of xenon (Xe) and hydrogen (H2). The CO, Xe and H2 are present in a specific concentration range. The specific range of the CO with Xe and H2 achieves both improved ion source life and ion source performance in comparison to conventional carbon ion implant processes, which have generally been able to only achieve increased C+ beam current at the expense of reduced deposit formation.

In accordance with one embodiment, the dopant gas composition is a mixture of CO, H2 and Xe in a specific volume ratio. The volume ratio of Xe:H2 can range from about 0.02-0.20 and the volume ratio of $(Xe+H_2):CO$ can range from about 0.10-0.30. In a more preferred embodiment, the volume ratio of Xe:H2 ranges from about 0.02-0.06 and the volume ratio of $(Xe+H_2):CO$ ranges from about 0.15-0.20. Such a compositional mixture improves the source life while maintaining acceptable levels of carbon ion (C+) beam current during carbon implant process. In other words, the composition has been found to have a significant impact on the ability to reduce the accumulation of deposits within the ion apparatus without a substantial reduction in C+ beam current, in comparison to a C+ beam current produced solely from CO.

Xe is an inert gas which is relatively easy to ionize and has a large ionization cross-section as a result of its relatively larger atomic size in comparison to other dopant gases. The term "ionization cross-section" as used herein and throughout the specification is defined as the probability that ionization will occur when an atom or molecule undergoes collision with an electron emitted from the ion source filament. The Xe present in the gas mix readily ionizes once the plasma is formed and augments the ionization of other species present in the plasma phase. The ionization effects of Xe were observed when applicants added Xe in a controlled amount to the CO and H2 mixture during ionization. An improvement in the beam current was ultimately observed, as will be discussed in the Examples.

The present invention is designed to maintain the amount of Xe added to CO+H2 mix in a specified compositional range to achieve improved performance during carbon ion implantation. The present invention recognizes that the C+ beam current is sensitive to the amount of Xe added to CO and H2. As will be shown in the Examples, Applicants observed unexpectedly the C+ beam current was detrimentally reduced when the proportion of Xe in the gas mix was increased well above the volume ratios for $(Xe+H_2):CO$ and Xe:H2, despite maintaining the net carbon-containing gas flow constant into the ion source chamber.

In addition to a lower C+ beam current at higher Xe levels, it was unexpectedly observed that the addition of Xe has a tendency to preferably ionize oxygen more than carbon. The effect is more pronounced at higher Xe levels.

Specifically, as the level of Xe in the dopant gas composition is increased beyond an upper threshold in relation to H2, the ratio of O+ to C+ also increases. Such an increase in the ratio of O+ to C+ is undesirable as it causes a drop in the relative proportion of C+ in the ions that are extracted out from the ion source. Additional O+ ions can readily react with W component in the arc chamber and generate WOx deposits which are not desired. Thus, the present invention recognizes the need to control the amount of Xe in the dopant gas composition to avoid a loss of C+ beam current and/or the formation of excessive WOx formation.

Generally, during ion implantation, an increase in the C+ beam current in comparison to the normal operating value is desired to meet the process requirements and/or improve the ion source equipment throughput. An increased C+ beam current can be achieved by operating the ion source at a higher arc current to increase the amount of ions extracted from out of the ion source. As will be explained in the Examples, Applicants observed that increasing arc current levels did not always result in increased C+ beam current levels. Rather, the response of the dopant gas composition to increasing arc current levels is dependent upon the relative amounts of CO, Xe and H2 of gas composition. The present invention recognizes that the response of the dopant gas composition to arc current levels plays a significant role in ultimately formulating the optimal dopant gas mix composition. The present invention takes into consideration the impact of the relative amounts of CO, Xe and H to formulate a dopant gas composition with favorable response to increasing arc current levels, thereby enabling end-users to achieve high C+ beam current in their ion source tools and meet requirements.

As mentioned, the present invention utilizes a CO—H2—Xe composition in a prescribed ratio of $(Xe+H_2):CO$ that ranges from about 0.1 to about 0.3. The exact ratio of $(Xe+H_2):CO$ that is selected is dependent upon numerous factors, including the manner in which the ion implantation is conducted. For example, some carbon ion implantation processes may tolerate higher amounts of deposits, but require higher C+ ion beam current (i.e., reduced dilution effect of the beam current). As a result, the ratio of $(Xe+H_2):CO$ is selected to be on the lower end of the prescribed range of ratios. Other carbon ion implant applications may require reduced deposits but may tolerate a slightly lower beam current, thereby selecting a composition on the higher end of the prescribed range of ratios.

The present invention is particularly advantageous for a carbon ion implantation process in which the preferred dopant mixture is CO pre-mixed with an inert diluent mixture consisting of xenon and hydrogen. In a preferred embodiment, the ability to deliver such a CO—H2—Xe composition as a mixture from a single supply source can improve performance of the ion implantation process. Furthermore, a single source supply can ensure delivery at the predetermined concentration in a safe and consistent manner.

As a single mixture of CO—H2—Xe that is stored under pressure and delivered from a single supply source, the present invention can maintain the correct blend concentration during storage and upon final delivery to the apparatus or tool.

In a preferred embodiment, the single supply source is a sub-atmospheric storage and delivery device used to store and deliver the CO-containing dopant gas mixture. The sub-atmospheric storage and delivery device is designed to maintain the dopant mixture in a pressurized state therewithin, while minimizing or eliminating the risk of developing a leak or catastrophic rupture that is typically associated with high pressure cylinders. The device is vacuum actuated so as to allow a controlled flow of the dopant mixture to a downstream process when a sub-atmospheric condition is achieved along the discharge flow path. The discharge of the CO-based mixture only occurs when a suitable discharge condition exists outside of the device, thereby avoiding an unintended release of the toxic CO-based mixtures from the storage and delivery device.

Figure 1B:
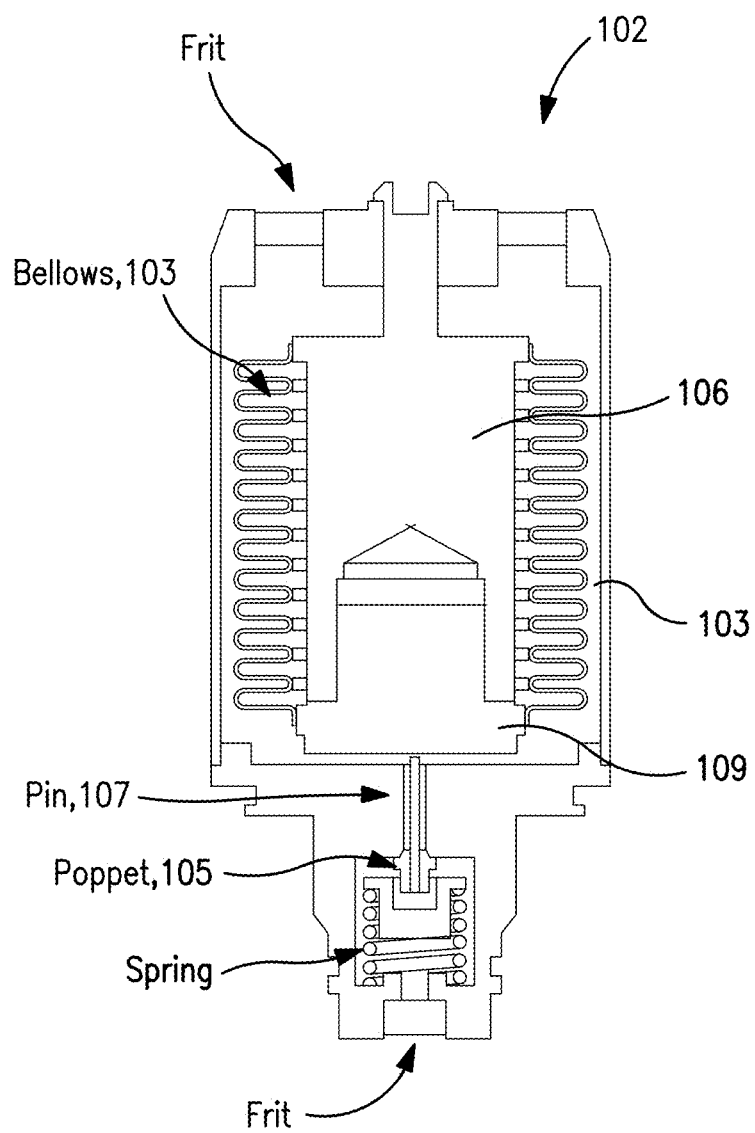

FIGS. 1a and 1b show an example of a sub-atmospheric storage and delivery device 100 with a vacuum actuated excess pressure check valve element 102. The vacuum actuated check valve element 102 is preferably disposed entirely within a storage container or cylinder 101. The sub-atmospheric storage and delivery device 100 may be a commercially available Uptime® delivery device, as sold by Praxair® and as disclosed in U.S. Pat. Nos. 5,937,895; 6,045,115; 6,007,609; 7,708,028; and 7,905,247, all of which are incorporated herein by reference in their entirety. The device 100 dispenses the CO-containing gas mixture from the cylinder 101 in a safe and controlled manner to an ion apparatus for carbon implantation.

The device 100 comprises a port body 104 for communication with the outlet of the pressurized cylinder 101. A movable valve element 105 (e.g., poppet) as shown in FIG. 1b is configured to move between a sealing position and an open position. In the sealing position, the valve element 105 blocks the flow of the pressurized CO-dopant gas mixture from the interior of the cylinder 101. An expandable bellows 103 located downstream of the valve element 105 is operably linked with the valve element 105 for controlling movement of the valve element 105 in a manner that retains the valve element 105 in the sealing position until a predetermined pressure differential between the inside and outside of the bellows 103 occurs. The bellows 103 is sealed at atmospheric pressure or greater, and in communication with the fluid discharge path. Accordingly, when the pressure condition outside the bellows 103 attains a sub-atmospheric condition, the bellows 103 attains a pressure differential between its interior bellows chamber 106 and outside, which causes the bellows 103 to expand. Expansion of the bellows 103 causes a pin 107 to move the valve element 105 to the open configuration, which creates a flow path for the CO-containing dopant mixture to flow from the interior of the cylinder 101 through the fluid discharge line and into the ion apparatus where carbon implantation can occur. A restrictive flow element such as capillaries 108 may optionally be affixed to the vacuum-actuated check valve element 102 to further control and limit the flow of the dopant gas mixture from the cylinder 101. Advantageously, external pressure regulators are not required for reducing the cylinder pressure to pressures acceptable for mass flow controllers utilized along the fluid discharge line.

Still referring to FIG. 1b, the valve element 102 is a vacuum actuated check valve comprising a poppet valve 105 with a valve base or contact plate 109 having a pin 107 inserted therethrough for communication with a bellows chamber 103 downstream. The pin 107 and the valve base 109 form a passageway therebetween. The pin 107 is adapted for reciprocal movement between a sealing position that blocks gas flow along the passageway and an open position that permits flow along the passageway. The bellows chamber 106 is disposed downstream of the valve base 109 and pin 107. The bellows chamber 106 defines an interior volume isolated from the pressure condition upstream of the pin 107. The bellows chamber 106 is adapted to expand when communication with a discharge path extending into an ion chamber produces a vacuum condition around the bellows 103 and forces the pin 107 to an open position to allow gas flow through the passageway in the valve base 109.

The above pin-poppet and bellows arrangement functions as a check valve assembly 102 that can be set to reliably actuate when a desired vacuum level in the downstream flow line is achieved. In this manner, opening of the valve element 102 is prevented until the pressure along the fluid discharge path drops to a vacuum condition. Because the typical end-user's ion apparatus operates at sub-atmospheric pressures of 100 torr or less, dispensing the CO-containing dopant gas mixture at a vacuum at pressure of, for example, 500 torr or less ensures that any leaks only leak into the ion apparatus where they can be quickly detected. As a result, the ion implantation process utilizing the sub-atmospheric delivery device 100 for delivering a CO-based dopant mixture does not require confirming the absence of leaks.

The vacuum actuated delivery and storage device 100 can deliver a pre-mixed supply of the CO, xenon and hydrogen at a pre-defined flow rate sufficient for carbon ion implantation to occur. Any flow rate is contemplated so long as the volume ratios of Xe:H2 and (Xe+H2)/CO are maintained within the ranges of the present invention. The ability to deliver the CO-based dopant gas concurrently with the diluent gas mixture at controlled flow rates and concentrations ensures that adequate beam current is produced within the ion chamber while significantly reducing carbon-based deposits by virtue of the presence of the diluent gas mixture. In this manner, the single supply source ensures optimal amounts of the CO-based dopant gas and diluent gas mixture can interact with each other within the ion chamber to reduce carbon-based deposits in the chamber while retaining the necessary carbon ionization. The single supply source can eliminate the process challenges encountered when separately flowing the dopant gas and the diluent gas into an ion chamber.

The present invention contemplates various other types of mechanical designs that can be employed to achieve sub-atmospheric delivery of the dopant gas mixture. For example, one or more valve elements and/or restrictive flow elements can be used to dispense and control delivery of the dopant gases sub-atmospherically. The valve elements are configured to open and deliver dopant gas when sub-atmospheric or vacuum conditions are applied to the delivery port of the cylinder. The valve elements and/or restrictive flow elements are located upstream of the cylinder valve seat with respect to flow of gas from the interior of the cylinder to the delivery port. The exact location can be within the port body, within the neck cavity or within the cylinder. Alternatively, the valve device can be located to extend along all three locations.

A combination of valve elements and/or restrictive flow elements can include pressure regulators, check valves, excess flow valves, capillaries and restrictive flow orifices in various arrangements. For example, two pressure regulators may be disposed in series within the cylinder to down regulate the cylinder pressure of the dopant gas to a predetermined pressure acceptable for downstream mass flow controllers which are contained along the fluid discharge line. Suitable designs for such a pressure regulator arrangement include the VAC® sub-atmospheric delivery device, commercially available from ATMI, Inc.

The challenges of storing CO-containing dopant gas compositions of the present invention must also be accounted for by proper design of the sub-atmospheric device 100 of FIGS. 1a and 1b. The present invention employs storage of CO-based dopant mixtures in a way that does not employ any carbon based adsorption media for binding the mixtures thereon. Carbon-containing adsorption media has an affinity for CO and, to a certain extent, hydrogen. Other adsorbent media may also have an affinity for the CO-containing gases, or otherwise have an adverse effect on the storage and delivery of the CO-dopant gas mixture. Accordingly, a non-adsorbent based storage system is employed to maintain the chemical integrity of the CO-containing dopant gas mixture and assure proper storage and sub-atmospheric delivery of the CO-containing gas mixture.

Additionally, the storage occurs in the absence of any ionic mixtures that are permanently retained within the cylinder for the purpose of ionically binding the gases during storage. The present invention has recognized that ionic solutions introduce contaminants into the CO-containing dopant mixtures at a level considered unacceptable for ion implantation processes in the semiconductor industry.

Furthermore, the delivery and storage device of the present invention employs a chemically inert cylinder surface to avoid any reaction of the dopant gas with the cylinder walls. In particular, the cylinders employed in the present invention are passivated prior to filling the cylinder with the dopant mixture. Preferably, the cylinder is passivated with a fluorine-based material to create a chemically inert cylinder wall surface. The passivation eliminates the tendency for the hydrogen-containing diluent gas to react with the oxides on the cylinder wall surface and form water vapor, which would contaminant the dopant mixture.

The ability to store CO-containing dopant gas compositions of the present invention is further impacted, at least in part, by the materials of construction of the cylinder. In this regard, the present invention recognizes that carbon steel cylinders are not suitable for the storage of CO-containing dopant compositions of the present invention, as carbon steel can pose a safety issue from the formation of iron carbonyl and other trace carbonyl compounds, which are highly toxic.

An additional safety issue is related to the failure of the carbon steel cylinder arising from stress corrosion cracking, which can occur as a result of a chemical reaction between CO, trace CO2 and moisture. Thus, in accordance with the principles of the present invention, the CO-containing dopant compositions are preferentially not stored in carbon steel cylinders. In one embodiment, a material of choice for cylinders containing CO-based dopant mixtures of the present invention is aluminum. Aluminum cylinders generally speaking do not exhibit the safety hazards described above.

Figure 2:
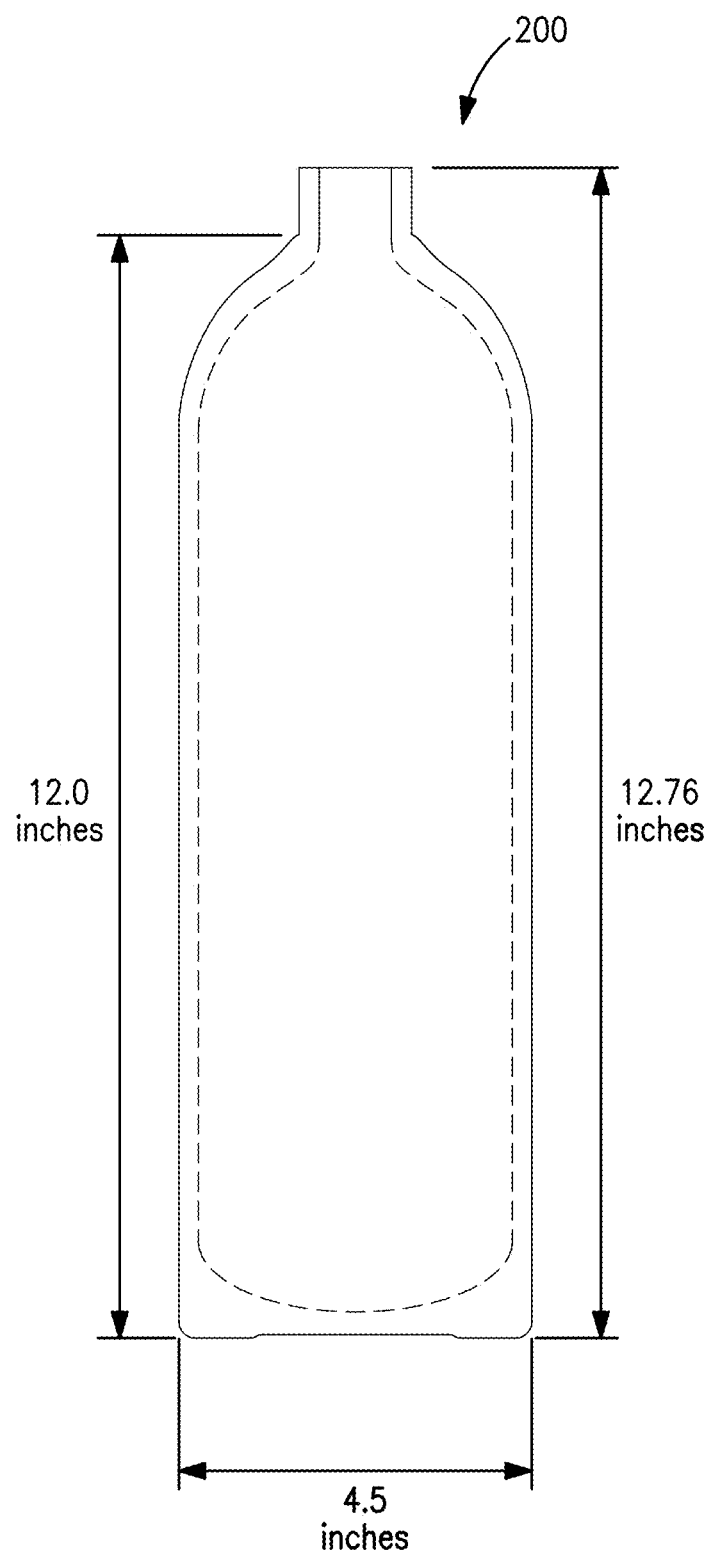
FIG. 2 shows an aluminum cylinder without a pressure relief device on the valve body, in which the cylinder has dimensions designed to maximize the internal storage volume for a CO-containing dopant gas composition.

In a preferred embodiment, the cylinders of the present invention may exclude a pressure relief device (PRD) by maintaining the cylinder dimensions at 12 inches or less in height, exclusive of the neck, and 4.5 inches or less in diameter. FIG. 2 shows an example of a cylinder 200 of aluminum material of construction whereby the cylinder has a height of 12 inches and a diameter of 4.5 inches. Such dimensions are below the dimensions requiring a PRD on the valve body of the cylinder 200 by the US Department of Transportation. Other heights and dimensions which fall outside the requirement for a PRD to be affixed to the valve body of cylinder 200 are contemplated by the present invention. FIG. 2 represents the maximum cylinder volume designed to not require a PRD.

Because the CO-dopant compositions of the present invention are toxic, the valve body of the cylinder is generally required to possess a pressure relieve device (PRD). The PRD is designed to vent the dopant gas CO-containing product in the event of a fire or over-pressurization. However, the present invention, by virtue of the vacuum actuated check valve assembly 102 of FIG. 1b, and the dimensions of the cylinder, incorporate sufficient built-in safety features to maintain safe handling and use without a PRD. Eliminating the PRD on the valve body 110 removes a potential leak path for toxic CO, thereby further enhancing the safety and structural integrity of the delivery device of the present invention. Such reliability was previously not possible with other conventional storage devices, including high pressure cylinders. Accordingly, a sub-atmospheric delivery package, such as that shown in FIGS. 1a and 1b, and further in which the cylinder is formed from aluminum and excludes a PRD such as shown in FIG. 2, is preferred for the safe and improved delivery of the CO-based dopant gas composition of the present invention.

The filling of the CO-containing dopant mixture within the storage cylinder occurs in a manner that allows homogenous mixing of the species. Each of the species of the dopant mixture can be filled sequentially in any order. Alternatively, each of the species can be pre-mixed upstream of the cylinder and then introduced therewithin as a single mixture.

When the CO-dopant gas mixture consists of condensable species, the filling preferably occurs such that the partial pressure of each of the species does not exceed its saturation vapor pressure. The maximum fill pressure of the cylinder should also not cause interaction between the species. For example, when the dopant mixture includes CO, xenon and hydrogen, the fill pressure cannot exceed a predetermined threshold at which dimerization of xenon and hydrogen may occur to form a chemical compound. Formation of a xenon-hydrogen compound prior to introduction into a downstream ion chamber can detrimentally alter the mechanism by which the diluent gas mixture tends to reduce carbon-based and tungsten-based deposits within the ion chamber as well as reduce C+ beam current. Accordingly, the present invention maintains storage and sub-atmospheric delivery of the species of the CO-dopant mixture under processing conditions that do not cause interaction of the species in the cylinder.

Figure 3:
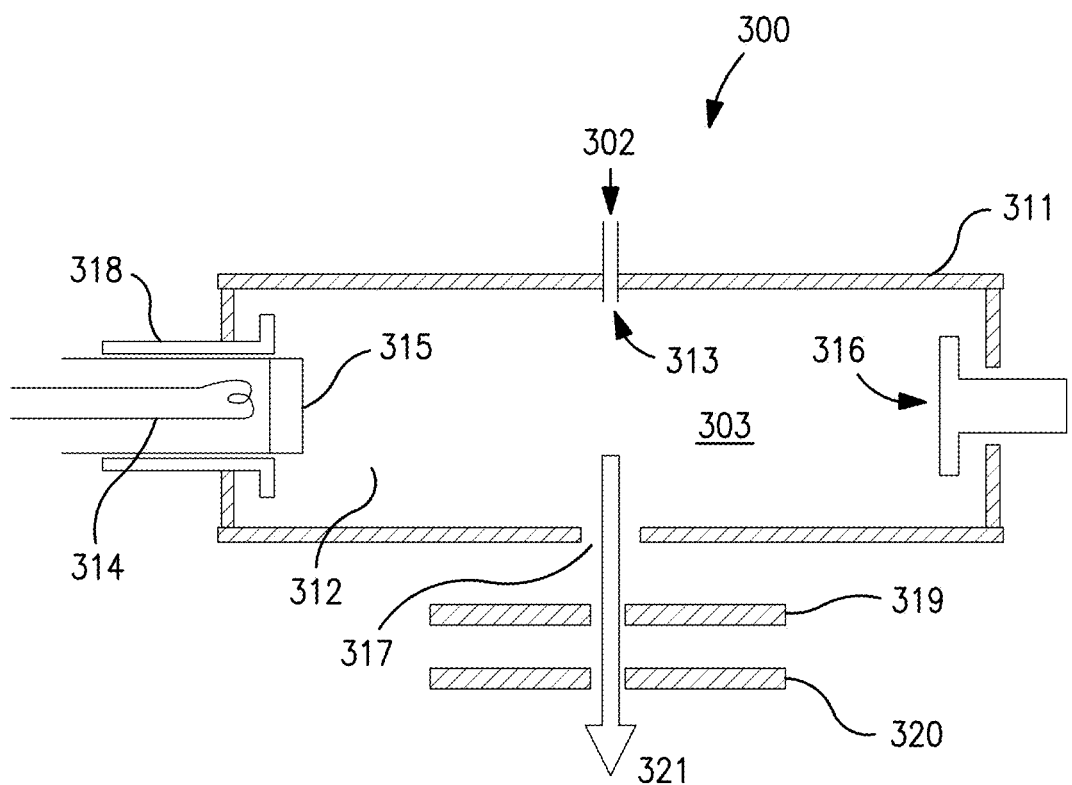
FIG. 3 shows an ion implanter used in accordance with the principles of the present invention.
Figure 4:
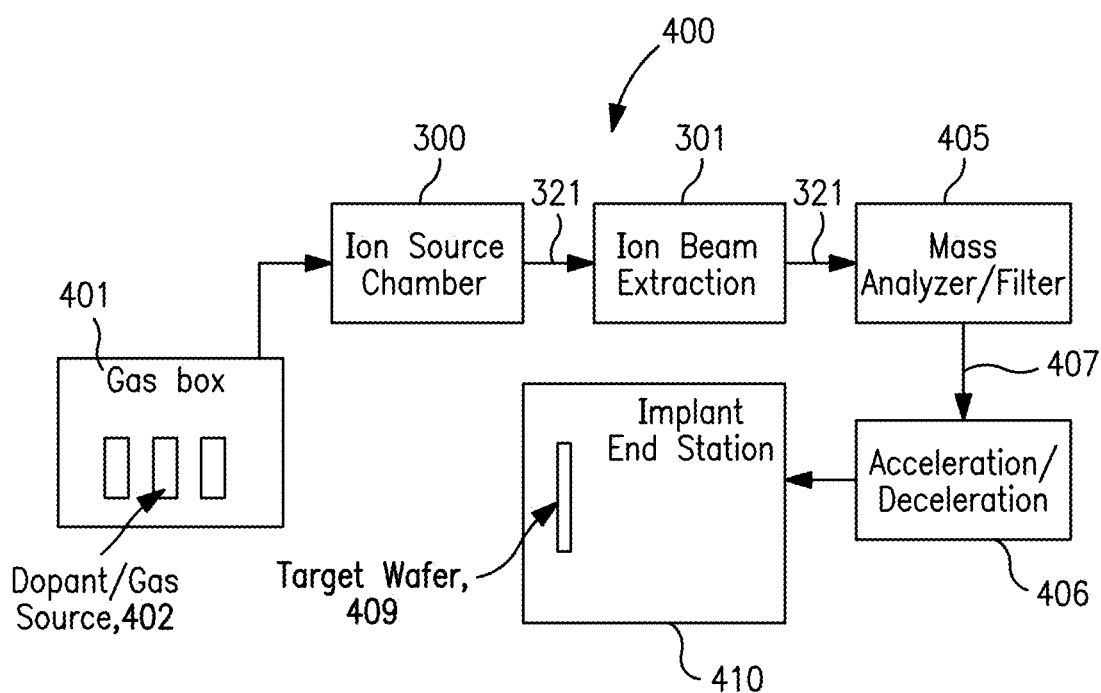
FIG. 4 shows the ion implanter of FIG. 3 within an implant system and process for carbon implantation.

With reference to FIGS. 3 and 4, an exemplary ion implantation apparatus 300 in accordance with the principles of the present invention is shown. Specifically, in one example, the ion source apparatus 300 of FIG. 3 can be used for producing an electron beam for implanting C+ ions. A dopant gas mixture 302 comprising CO, Xe and H2 is introduced into the ion source chamber 312 through a gas feed line 313 extending through arc chamber wall 311. In one embodiment, the volumetric ratio of (Xe+H2):CO ranges from about 0.1 to about 0.3 and the volumetric ration of Xe: H2 ranges from about 0.02-0.20. The supply of the dopant gas mixture 302 is preferably provided by a single supply source 402 (FIG. 4) contained within a gas box 401. The supply source 402 is preferably a single sub-atmospheric delivery and storage device as shown in FIGS. 1a and 1b that maintains the CO+Xe+H2 in a pressurized state within an interior volume therewithin. FIG. 4 shows that the delivery and storage device 402 is in fluid communication with a discharge flow path extending into the ion source apparatus 300. The sub-atmospheric delivery and storage device 402 is actuated to allow a controlled flow of the dopant gas mixture 302 from the interior volume of the device 402 in response to a sub-atmospheric condition achieved along the discharge flow path.

Referring to FIG. 3, the dopant gas mixture 303 inside the chamber 312 is subject to ionization by applying a predetermined voltage from a power supply source (not shown) to resistively heat a filament 314 positioned in close proximity to an indirectly heated cathode (IHC) 315. The filament 314 may be negatively biased relative to the IHC 315. Insulator 318 electrically and thermally isolates IHC 315 from the arc chamber wall 311. Electrons emitted from the filament 314 accelerate towards the IHC 315 to heat the IHC 315 to its own thermionic emission temperature. The electrons emitted by the IHC 315 accelerate and travel towards into the ion chamber 312 to ionize the dopant gas mixture 303 located therein. The ionized gas molecules of the dopant gas mixture 303 produce a plasma environment. Repeller electrodes 316 may be placed diametrically opposed to the IHC 315 to confine the plasma environment and sustain and control the ionization of the dopant gas mixture 303 within the chamber 312. The repeller electrode316 builds up a negative charge to repel the electrons back towards the dopant gas mixture 303 to collide therewith and sustain ionization of the dopant gas mixture 303.

Ionization of the dopant gas mixture 303 causes the carbon to be released as ions, radicals or combinations thereof. By controlling the ratio of Xe to H2 and controlling the ratio of Xe+H2 to CO in accordance with the present invention, C+ beam current remains sufficient and deposits such as C-based and oxide-based deposits are reduced to enable sustained operation of the ion source 300. The C+ beam current is sustained throughout the ion implant process.

The carbon ions are extracted from the ion source chamber 312 in the form of the carbon ion beam of desired energy. The techniques for suitable extraction can be carried out by applying a high voltage across extraction electrodes, which consists of suppression electrodes 319 and ground electrodes 320. As shown in FIG. 3, each of these suppression and ground electrodes 319 and 320, respectively, has an aperture aligned with the extraction aperture 317 to ensure that the carbon ion beam 321 extracted out of the arc chamber 312 is well-defined.

FIG. 4 shows the ion source apparatus 300 of FIG. 3 incorporated into a carbon beam line ion-implant system 400. The dopant gas mixture 302 is introduced from gas box 401. The dopant gas mixture 302 is introduced into an ion source chamber 300 where energy is introduced into the chamber to ionize the CO as has been described with reference to FIG. 3.

Upon generation of the desired carbon ion beam at the desired current, an ion beam extraction system 401 is used to extract the ions and radicals from the ion source chamber 413 in the form of an ion beam 421 of desired energy. Extraction can be carried out by applying a high voltage across extraction electrodes. The extracted beam 421 is transported through a mass analyzer/filter 405 to select the carbon ions to be implanted. The filtered ion beam 407 can then be accelerated/decelerated 406 and transported to the surface of a target workpiece 409 positioned in an end station 410 for implantation of carbon ions (i.e., C+) into the workpiece 409. The carbon ions of the beam collide with and penetrate the surface of the workpiece 409 at a specific depth to form a doped region with the desired electrical and physical properties. The present invention allows productivity to be maintained or increased as a result of extended source life and sufficient C+ beam current.

It should be understood other suitable types of ion sources besides the ion source 300 of FIG. 3 can be employed, including, for example, the Freeman sources, Bernas sources and RF plasma sources.

Although delivery of each of the gaseous species can occur from a single source supply (e.g., sub-atmospheric delivery device), it should be understood that one or more of the CO, Xe and H2 species can be introduced from dedicated supply sources in a manner that they combine upstream or within the ion source chamber to form the dopant composition at the volumetric ratios of the present invention. In one example, a first supply vessel comprises CO and a second supply vessel comprises Xe and H2. The first and second supply vessels are provided as part of a gas kit. In this manner, the CO, Xe and H2 can be co-flown (i.e., the flow of the gases into the chamber may occur substantially simultaneously), or sequentially flowed in any order into the ion source chamber. By way of example, CO may be delivered from a single sub-atmospheric delivery device, and H2 and Xe may be delivered from another sub-atmospheric delivery device. The delivery devices can be configured within the gas box 401 shown in FIG. 4. The CO, Xe and H2 form the resultant compositional mixture either upstream of the ion source chamber 300 or within the ion source chamber 300.

In another example, each of the CO, Xe and H2 gas mixture are supplied from individual cylinders, preferably sub-atmospheric delivery and storage devices such as that of FIG. 1a. In operation, the CO, Xe and H2 would be co-flowed or sequentially flowed into the ion source chamber 300 at specific flow rates that ensure optimal volume ratios of $(Xe+H_2):CO$ and Xe:H2 in accordance with the present invention are produced and maintained upstream or within the ion source chamber 300 throughout the carbon implantation process.

CO may be mixed with more than one carbon-based containing gas to achieve the desired dopant gas mix. In one embodiment, the CO can be mixed with a fluorine-containing gas having the general formula CxFy. The fluorine containing gas may be chosen from but not limited to CF4, C2F6, C2F4, C2F2, C3F8 and C4F8 and any mixture thereof The sub-atmospheric delivery of the combination of CO with the fluorine-containing gas within a specific concentration range that is pre-mixed with a diluent gas mixture creates an improved dopant gas mixture capable of minimizing a wide array of problematic deposits onto surfaces of the chamber without compromising the ability of the CO and the fluorine-containing gases to each provide carbon ions to produce a carbon ion beam having sufficient beam current. For example a mixture of 5% volume CF4 and CO may result in significantly lower carbide-based deposits inside the ion-source chamber. The addition of xenon and hydrogen to the gas composition significantly reduces the extent of tungsten etching on the chamber wall. Preferably, the mixture is stored and delivered from a single source such as a sub-atmospheric delivery device. However two or more devices may be used for delivery into an ion source chamber. The present invention offers the ability to safely store and sub-atmospherically deliver such species such that there is improvement in the performance of the ion source during carbon implantation.

Additionally, with regards to the diluent gas composition, the present invention contemplates various hydrogen-containing gases besides H2. By way of example, the hydrogen-containing gas can contain CH4, C2H2, C2H4, C2H6 and any mixture thereof. Other inert gases besides xenon can be utilized, such as, for example, argon, neon or krypton. Any combination of argon, neon, krypton, and xenon is contemplated by the present invention. The alternative carbon-containing, hydrogen-containing and inert gases disclosed herein can be pre-mixed or individually flowed (e.g., co-flowed or sequentially flowed) at the volume ratios utilized for CO, Xe and H2.

Figure 5:
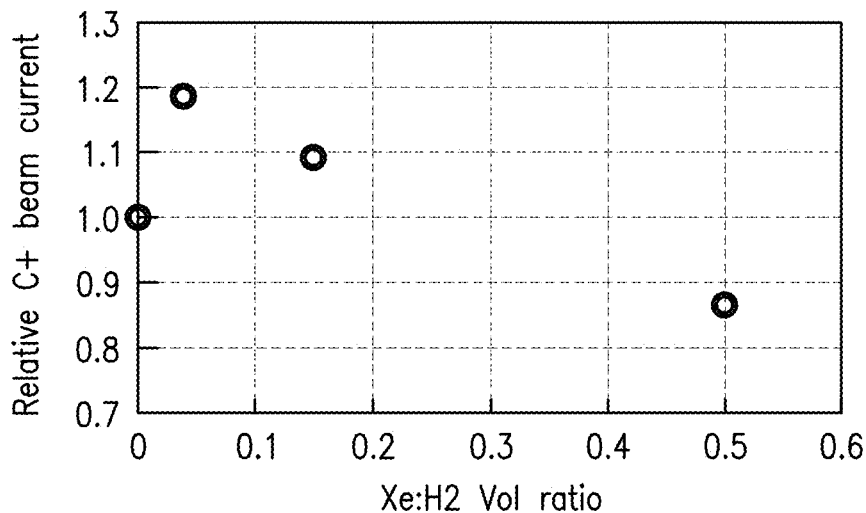
FIG. 5 shows the relative C+ beam current for different compositions of CO+H2+Xe dopant gas compositions.
Figure 6:
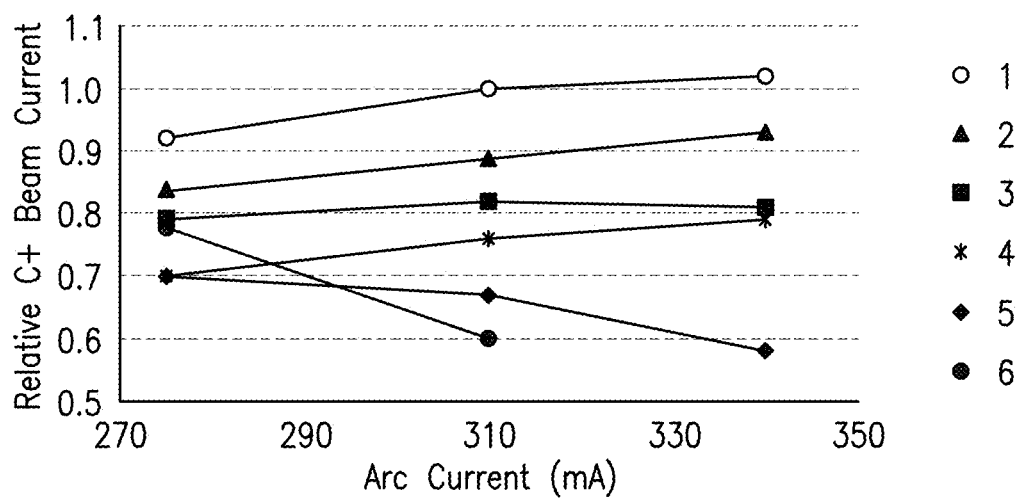
FIG. 6 shows relative C+ beam currents for different dopant compositions of CO+H2+Xe at three different arc current levels.

The Examples below show that different CO-based dopant gas compositions as listed in Table 1 were introduced into an ion source chamber and evaluated. Each of the mixtures was ionized to produce a corresponding C+ beam, which was subsequently extracted. For all composition splits, the flow of CO was kept constant to ensure the same amount of carbon-containing gas was introduced into the ion source. The ratio of [Xe+H2]:CO ratio for different compositions was also maintained at 0.20 to keep the extent of dilution constant with a non-carbon containing gas. The ratios also ensured that critical process conditions such as total flow rate and pressure inside the arc chamber was similar for all the test runs, thereby allowing a proper comparison and evaluation of the effects of the varying proportions of Xe added to the dilution gas and CO. As will be further described, the results in FIG. 5 are normalized with respect to CO +H2 in order to assess the effects of the addition of Xe to CO and H2. Further, the results in FIG. 6 are normalized with respect to CO only (Gas Mix #1) at 310 mA arc current in order to assess the extent of beam current drop-off when utilizing a particular CO+Xe+H dopant composition.

Comparative Example 1 (CO Only)

An experiment was conducted to evaluate the performance of the ion source while using a dopant gas composition of CO only (Gas Mix 1 as listed in Table 1), and in particular to evaluate the C+ beam current obtained from the ionization of CO. The ion source that was utilized was a hot cathode style design, which consists of a helical filament and an anode placed perpendicular to the axis of the filament.

CO was introduced into the ion source chamber. The CO was supplied using a single sub-atmospheric delivery UpTime® device commercially available from Praxair, Inc.

Power was applied to the filament to generate electrons. The filament also served as a cathode and therefore a potential difference between the anode and the filament was generated to create a plasma to ionize the CO gas present in the ion source chamber. The power applied to the filament was varied to obtain different arc currents. Specifically, experiments were conducted at three different arc current settings, namely of 275 mA, 310 mA and 340 mA. The C+ beam current at each of the three different arc currents was measured. Additionally, the ionization was also conducted for an extended duration to evaluate the amount and nature of deposits formed during ionization of CO.

Figure 7A:
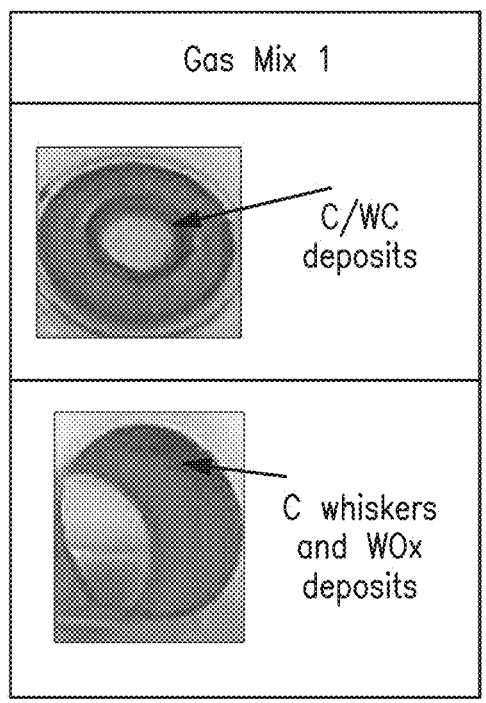
FIGS. 7a and 7b show deposit formation during carbon implantation utilizing CO only and a CO-containing dopant composition of the present invention, respectively.

The beam current results are shown in FIG. 6. FIG. 6 shows that utilizing only CO generated the highest beam current at all arc current levels. However, the accumulation of the deposits was observed to be the highest (FIG. 7a). FIG. 7a shows that C and tungsten carbide (WC) containing deposits were observed in the anode region. Additionally, FIG. 7a shows that C containing whiskers and some WOx deposits were also observed on the ion source arc chamber wall.

Comparative Example 2 (CO+H2)

An experiment was conducted to evaluate the performance of the ion source while using a dopant gas composition of $CO+H_2$ (Gas Mix 4 as listed in Table 1), and in particular to evaluate the C+ beam current obtained from ionization of $CO+H_2$ mix. The ion source was a hot cathode style which consisted of a helical filament and an anode placed perpendicular to axis of the filament. Power was applied to the filament to generate electrons. The filament also served as a cathode so that a potential difference between anode and the filament was created to produce a plasma to ionize the gas present in the ion source chamber.

CO and H2 were supplied using a sub-atmospheric delivery UpTime® device which contained CO and H2 in a volumetric ratio of 1.0:0.20 as shown in Table 1. The flow rate of CO was maintained equal to the flow rate of CO in Comparative Example 1 to ensure an equal amount of carbon containing gas was introduced into the ion source.

The power applied to the filament was varied to obtain different settings of 275 mA, 310 mA and 340 mA. As the arc current was changed, different C+ beam currents were produced. The C+ beam current at each of the different arc currents was measured as shown in FIG. 6. Specifically, the experiments were conducted at three different arc current settings of 275 mA, 310 mA and 340 mA. A desirable response to increasing arc current was observed where the C+ beam current increased with increasing arc current. However, the C+ beam current obtained with the CO+H2 mix was on average 25% lower than beam current obtained using CO only (FIG. 6) for all of the arc current levels. Due to a significant drop in beam current in comparison to CO only, the extended operation of the test to evaluate the nature of deposits was not considered useful.

Comparative Example 3 (CO+Xe+H2)

An experiment was conducted to evaluate the performance of the ion source while using a dopant gas composition of CO+Xe+$H_2$ (Gas Mix 5 as listed in Table 1), and in particular to evaluate the C+ beam current obtained from ionization of such a composition. The ion source was a hot cathode style which consisted of a helical filament and an anode placed perpendicular to axis of the filament. Power was applied to the filament to generate electrons. The filament also served as a cathode and a potential difference between anode and the filament created a plasma to ionize the gas present in the ion source chamber.

CO and a pre-mixed mixture of Xe+$H_2$ (50 vol % Xe, balance $H_2$) were supplied using separate sub-atmospheric delivery UpTime® devices, respectively. The CO and Xe+H2 were mixed in the flow line before being introduced to the ion source. The flow rates of CO and the mixture of Xe+H2 were controlled to achieve a desired volumetric ratio of CO:(Xe+$H_2$) of 1.0: 0.2, as shown in Table 1 below. The flow of CO was maintained equal to the CO flow in Comparative Example 1 to ensure an equal amount of carbon-containing gas was introduced into the ion source.

The power applied to the filament was varied to obtain different arc currents. As the arc current was changed, different C+ beam currents were produced. The C+ beam current at each of the different arc currents was measured as shown in FIG. 6. Specifically, the experiments were conducted at three different arc current settings of 275 mA, 310 mA and 340 mA. Contrary to Gax Mix#2, the CO+H2+Xe gas composition exhibited a negative correlation to arc current (FIG. 6) in which an increase in arc current produced a decrease in C+ beam current. On average, FIG. 6 shows the gas mix exhibited 35% lower beam current compared to CO only. Additionally, FIG. 5 shows a reduction in beam current of over 10% in comparison to a gas mixture of CO+H2 (Comparative Example 2), thereby demonstrating that addition of Xe actually lowered C+ beam current. Due to a significant drop in beam current, extended operation to evaluate the nature of the deposits was not considered useful.

Comparative Example 4 (CO+Xe)

An experiment was conducted to evaluate the performance of the ion source while using a dopant gas composition of CO+Xe (Gas Mix 6 as listed in Table 1), and in particular to evaluate the C+ beam current obtained from ionization of such a composition. The ion source was a hot cathode style which consisted of a helical filament and an anode placed perpendicular to axis of the filament. Power was applied to the filament to generate electrons. The filament also served as a cathode and a potential difference between anode and the filament was created to produce a plasma for ionization of the gas present in the ion source chamber. CO and Xe was supplied using a sub-atmospheric delivery UpTime® device which contained CO and Xe in a volumetric ratio of 1.0:0.05, as shown in Table 1. The flow rate of CO was maintained equal to the flow rate of CO in Comparative Example 1 to ensure equal amounts of C-containing gas was introduced into the ion source.

The power applied to the filament was varied to obtain different arc currents. As the arc current was changed, different C+ beam currents were produced. The C+ beam current at each of the different arc currents was measured as shown in FIG. 6. Specifically, the experiments were conducted at three different arc current settings of 275 mA, 310 mA and 340 mA. This CO+ Xe gas composition exhibited a negative correlation to arc current. On average, FIG. 6 showed that the gas composition mix exhibited 35% lower C+ beam current compared to CO only (Comparative Example 1). The C+ beam current obtained with this CO+Xe mix was on average 20%-40% lower than the beam current obtained using CO only.

Additionally, the ionization was conducted for an extended duration to evaluate the amount and nature of deposits formed during ionization of this specific gas composition of CO+Xe mix. Large amounts of WOx and C-based deposits in the anode region and on the arc chamber wall were observed.

Example 1 (CO+Xe+H2)

An experiment was conducted to evaluate the performance of the ion source while using a dopant gas composition of CO+Xe+H2 (Gas Mix 2 as listed in Table 1), and in particular to evaluate the C+ beam current obtained from ionization of such a composition. The ion source was a hot cathode style which consisted of a helical filament and an anode placed perpendicular to axis of the filament. Power was applied to the filament to generate electrons. The filament also served as a cathode and a potential difference between anode and the filament was created to produce a plasma for ionization of the gas present in the ion source chamber.

CO and a premixed diluent mixture of Xe+$H_2$ (4 vol % Xe, balance $H_2$) were supplied using separate sub-atmospheric delivery UpTime® devices for the CO and the diluent Xe+H2 mixture. The CO and the diluent mixture were mixed in the flow line before being introduced to the ion source. The flow rates of CO and the mixture of Xe+H2 were controlled to achieve a desired volumetric ratio of CO:Xe+$H_2$ of 1.0: 0.2, as shown in Table 1. The flow of CO was maintained equal to the flow of CO in Comparative Example 1 to ensure that equal amounts of C-containing gas were introduced into the ion source.

The power applied to the filament was varied to obtain different arc currents. As the arc current was changed, different C+ beam currents were produced. The C+ beam current at each of the different arc currents was measured as shown in FIG. 6. Specifically, the experiments were conducted at three different arc current settings of 275 mA, 310 mA and 340 mA. A desirable response to increasing arc current was observed where the C+ beam current increased with increasing arc current. On an average, this CO+H2+Xe gas mix exhibited only 10% lower beam current compared to CO only (FIG. 6) but about 20% higher beam current compared to the CO+H2 gas mix (FIG. 5).

Figure 7B:
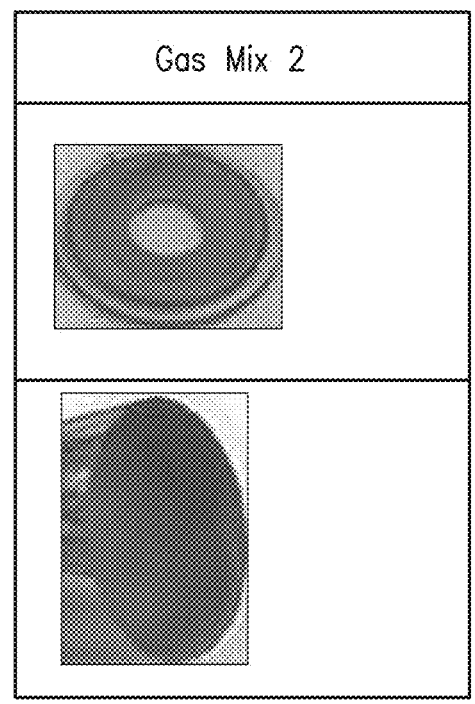

Additionally the ionization was conducted for an extended duration to evaluate the amount and nature of deposits formed during ionization of this specific gas composition of CO+Xe+H2 mix. The data is presented in FIG. 7b. FIG. 7b shows that the gas mix was observed to produce significantly lower C, WC and WOx containing deposits than the CO only case shown in FIG. 7a.

Example 2 (CO+Xe+H2)

An experiment was conducted to evaluate the performance of the ion source while using a dopant gas composition of CO+Xe+H2 (Gas Mix 3 as listed in Table 1), and in particular to evaluate the C+ beam current obtained from ionization of such a composition. The ion source was a hot cathode style which consisted of a helical filament and an anode placed perpendicular to axis of the filament. Power was applied to the filament to generate electrons. The filament also served as a cathode and a potential difference between anode and the filament was created to produce a plasma for ionization of the gas present in the ion source chamber.

CO and a premixed diluent mixture of $Xe+H_2$ (15 vol % Xe, balance $H_2$) were supplied using separate sub-atmospheric delivery UpTime® devices for the CO and the diluent Xe+H2 mixture. The CO and the diluent mixture were mixed in the flow line before being introduced to the ion source. The flow rates of CO and the mixture of Xe+H2 were controlled to achieve a desired volumetric ratio of $CO:Xe+H_2$ of 1.0: 0.2. The flow of CO was maintained equal to the flow of CO flow in Comparative Example 1 to ensure equal amounts of C-containing gas were introduced into the ion source.

The power applied to the filament was varied to obtain different arc currents. As the arc current was changed, different C+ beam currents were produced. The C+ beam current at each of the different arc currents was measured as shown in FIG. 6. Specifically, the experiments were conducted at three different arc current settings of 275 mA, 310 mA and 340 mA. The C+ beam current increased when the arc current was increased from 275 mA to 310 mA. A marginal drop in beam current was observed when the arc current was increased to 310 mA. On an average, the gas mix exhibited about 20% lower beam current compared to CO only.

The Examples demonstrate the benefits of introducing a dopant composition comprising CO, Xe and H2 in controlled amounts into the ion chamber. The Examples further demonstrate that relative C+ beam current is sensitive to Xe and that the ratio of Xe/H should be maintained within a controlled range. Xe additions can increase C+ beam current by about 20% in comparison to CO+H2 (as shown in FIG. 5) thereby preventing a substantial drop-off in C+ beam current in comparison to CO only (Comparative Example 1 and FIG. 6). However, excessive addition of Xe can lower C+ beam current in comparison to CO+H2 (as shown in FIG. 5), and therefore lead to significant drop-off in C+ beam current in comparison to CO only (Comparative Example 1 and FIG. 6). Furthermore, excessive Xe can undesirably create a negative correlation with increasing arc current. Still further, excessive Xe can lead to undesirable deposit formation, which can shorten ion source life. Accordingly, the present invention recognizes that the addition of X in controlled amounts to CO and H2 can produce an acceptable C+ beam current and reduce formation of deposits. The present invention offers a unique CO-dopant composition having a combination of performance characteristics previously considered mutually exclusive.

TABLE 1

| Gas Mix | CO | Xe | H2 |
|---|---|---|---|
| 1 | 1.0 | 0.0 | 0.0 |
| 2 | 1.0 | 0.008 | 0.19 |
| 3 | 1.0 | 0.03 | 0.17 |
| 4 | 1.0 | 0.0 | 0.20 |
| 5 | 1.0 | 0.1 | 0.1 |
| 6 | 1.0 | 0.05 | 0.0 |

Gas mix compositions for data presented in FIGS. 5 and 6. All values are expressed as volume ratios.

Hence the inventive dopant gas mixture was observed to reduce deposits in the ion chamber when utilizing a CO based dopant gas source for carbon implantation while still generating a sufficient C+ beam current level.

It should be understood that the gas composition of the present invention has other applications. For instance, the gas composition can be utilized in chemical vapor deposition or atomic layer deposition processes under suitable processing conditions to alter the gas mixture chemistry so as to cause deposition of a thin film carbon layer. Alternatively, the gas composition can also be utilized to reduce a metal oxide layer to a metallic layer. By way of example, tungsten oxide can be annealed in a CO and/or CF4 environment to reduce the tungsten oxide to a metallic tungsten layer. CO acts as a reducing gas to extract oxygen from the tungsten oxide layer, thereby reducing the tungsten oxide to elemental tungsten. Additionally, the presence of the CF4 may accelerate the reduction of tungsten oxide to elemental tungsten by potentially fluorinating the tungsten oxide layer, thereby enhancing its removal rate. The net result is the ability for tungsten oxide to revert to a pure tungsten layer more quickly.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A single source supply for a dopant gas mixture comprising:
   one or more carbon-containing dopant source gases premixed at a predetermined concentration with a diluent gas mixture, said one or more carbon-containing sources comprising at least CO, and said diluent gas mixture comprising an inert gas and a hydrogen-containing gas; and
   a sub-atmospheric delivery and storage device for maintaining the dopant gas mixture in a pressurized state within an interior volume of the device, said delivery device in fluid communication with a discharge flow path, wherein said delivery device is actuated to allow a controlled flow of the dopant composition from the interior volume of the device in response to a sub-atmospheric condition achieved along the discharge flow path.

2. The single source supply for the dopant gas mixture of claim 1, wherein the inert gas is selected from the group consisting of xenon, argon, neon, krypton or any combination thereof.

3. The single source supply for the dopant gas mixture of claim 1, wherein said one or more carbon-containing sources is selected from the group consisting of C2F6, CF4, C4F8, C2F4, CH4, C2H2 and mixtures thereof.

4. The single source supply for the dopant gas mixture of claim 1, wherein said one or more carbon-containing sources is CO, and said diluent gas mixture consists essentially of xenon and hydrogen.

5. The single source supply for the dopant gas mixture of claim 1, wherein the sub-atmospheric delivery and storage device comprises a cylinder formed from aluminum and a valve body, and further wherein said valve body is characterized by the absence of a pressure relief device.

6. The single source supply for the dopant gas mixture of claim 1, wherein the sub-atmospheric delivery and storage device comprises a combination of one or more valve elements and/or restrictive flow elements selected from the group of pressure regulators, check valves, excess flow valves and restrictive flow orifices.

7. The single source supply for the dopant gas mixture of claim 6, wherein the delivery and storage device comprises one or pressure regulators disposed in series within the interior of the cylinder.

8. The single source supply for the dopant gas mixture of claim 6, wherein the restrictive flow element comprises capillaries.

9. The single source supply for the dopant gas mixture of claim 1, wherein the delivery and storage device comprising a cylinder having an interior defined by passivating wall surfaces.

10. The single source supply for the dopant gas mixture of claim 1, said delivery and storage device characterized by an absence of adsorption media or ionic mixtures contained therewithin.

11. A method for delivering a dopant gas composition for ion implantation comprising:
    actuating controlled flow of one or more carbon-containing dopant gases in response to a predetermined vacuum condition;
    actuating controlled flow of a diluent gas composition in response to the predetermined vacuum condition;
    introducing the one or more carbon-containing dopant gases into an ion source chamber;
    introducing the diluent gas composition into the ion source chamber;
    ionizing the one or more carbon-containing dopant gas sources to produce carbon ions; and
    implanting the carbon ions into a substrate;
    wherein the one or more carbon-containing dopant gas sources interacts with the diluents gas composition to reduce deposits along the carbon ion source without producing a substantial reduction in carbon ion beam current in comparison to pure CO.

12. The method of claim 11, wherein the one or more containing carbon sources comprises CO in a first supply source and the diluent gas composition comprises Xe and H2 in a second supply source, wherein said Xe and H2 are in a predefined volume ratio ranging from about 0.02 to about 0.20 and the (Xe+$H_2$):CO in the ion source chamber is contained in a predefined volume ratio ranging from about 0.10 to about 0.30.

13. The method of claim 11, further comprising the step of pre-mixing the CO, xenon and hydrogen.

14. The method of claim 12, further comprising co-flowing or sequentially flowing a stream of the CO from the first supply source with a stream of the Xe and $H_2$ from the second supply source.

15. A gas composition comprising:
    a carbon-based material comprising carbon monoxide;
    an inert diluent gas mixture comprising xenon (Xe) and hydrogen (H2), wherein the Xe and the H2 are contained in an effective amount, said effective amount being in a volume ratio of Xe:H2 from about 0.02 to about 0.20; and
    wherein said (Xe+$H_2$):CO is contained in a volume ratio ranging from about 0.10 to about 0.30.

16. The gas composition of claim 15, wherein the gas composition is pre-mixed as a dopant mixture within a single source supply.

17. The gas composition of claim 16, wherein the single source supply is a sub-atmospheric delivery and storage device for maintaining the dopant mixture in a pressurized state within an interior volume of the device, said delivery device in fluid communication with a discharge flow path, wherein said delivery device is actuated to allow a controlled flow of the dopant mixture from the interior volume of the device in response to a sub-atmospheric condition achieved along the discharge flow path and extending into an ion source chamber.

18. The gas composition of claim 15, wherein the Xe:H2 is contained in a volume ratio ranging from about 0.02 to about 0.06.

19. The gas composition of claim 15, wherein the (Xe+$H_2$):CO is contained in a volume ratio ranging from about 0.15 to about 0.20.

20. The gas composition of claim 15, wherein a first supply vessel comprises CO and a second supply vessel comprises Xe and H2, said first and second vessels provided as part of a gas kit.

21. The gas composition of claim 20, wherein each of said first and said second supply vessels is a sub-atmospheric delivery and storage device for maintaining the CO and the Xe and H2 in a pressurized state within an interior volume of the device, wherein each of said first and said second supply vessels is actuated to allow a controlled flow of the CO and the Xe and H2 from the interior volume of said corresponding first and second supply vessels in response to a sub-atmospheric condition achieved along the discharge flow path and extending into an ion source chamber.

* * * * *